United States Patent
Yang

(10) Patent No.: US 8,850,284 B2
(45) Date of Patent: Sep. 30, 2014

(54) FLASH MEMORY CONTROLLER AND DATA READING METHOD

(75) Inventor: Tsung-Chieh Yang, Hsinchu (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 91 days.

(21) Appl. No.: 13/552,651

(22) Filed: Jul. 19, 2012

(65) Prior Publication Data

US 2013/0024751 A1 Jan. 24, 2013

(30) Foreign Application Priority Data

Jul. 21, 2011 (TW) .............................. 100125777 A

(51) Int. Cl.
*H03M 13/37* (2006.01)
*H03M 13/00* (2006.01)
*G06F 11/10* (2006.01)
*G06F 11/14* (2006.01)
*H03M 13/15* (2006.01)

(52) U.S. Cl.
CPC ....... *G06F 11/1068* (2013.01); *H03M 13/3715* (2013.01); *H03M 13/6502* (2013.01); *G06F 11/1405* (2013.01); *H03M 13/152* (2013.01); *H03M 13/1525* (2013.01)
USPC ............................ 714/751; 714/781; 714/785

(58) Field of Classification Search
USPC ........ 714/781, 785, 784, 746, 719, 42, 22, 13
See application file for complete search history.

(56) References Cited

U.S. PATENT DOCUMENTS

| | | | | |
|---|---|---|---|---|
| 5,822,251 A | * | 10/1998 | Bruce et al. | 365/185.33 |
| 5,956,743 A | * | 9/1999 | Bruce et al. | 711/103 |
| 7,783,886 B2 | * | 8/2010 | Walmsley | 713/176 |
| 2007/0121359 A1 | * | 5/2007 | Kanda | 365/51 |
| 2009/0132302 A1 | | 5/2009 | Beekhuis | |
| 2011/0289385 A1 | * | 11/2011 | Takeuchi et al. | 714/764 |

FOREIGN PATENT DOCUMENTS

| | | |
|---|---|---|
| TW | 200915328 | 4/2009 |
| TW | 200919171 | 5/2009 |
| TW | 200943300 | 10/2009 |

* cited by examiner

*Primary Examiner* — Fritz Alphonse
(74) *Attorney, Agent, or Firm* — Winston Hsu; Scott Margo

(57) ABSTRACT

A data reading method is provided. The data reading method includes: utilizing a first sense voltage to read a data unit from a flash memory block; performing an error detection operation on the data unit and calculating an error polynomial according to a detection result; and determining whether the error polynomial conforms to a predetermined condition and deciding whether to perform read retry on the data unit according to a determining result.

12 Claims, 5 Drawing Sheets

FLASH MEMORY CONTROLLER AND DATA READING METHOD

BACKGROUND OF THE INVENTION

1. Field of the Invention

The present invention relates to a flash memory accessing scheme, and more particularly to a flash memory controller and corresponding data reading method for a flash memory.

2. Description of the Prior Art

Generally speaking, since information of data content read from a flash memory may include erroneous information during data accessing, the currently developed technique is applied to encode raw data and then store the encoded data into the flash memory when storing data content, and to read the encoded data from the flash memory and then decode the encoded data to obtain the raw data when reading data content. Although the encoding/decoding operation can be used to correct error bits, this however is merely used to correct a part of error bits. Once too many error bits included within data content, after the decoding operation is finished, a conventional flash memory controller obtains a decoding result indicates that the conventional flash memory controller is unable to properly decode (or correct) the encoded data. As a result, an operation of data read retry is necessary to be performed for reading the encoded data from the flash memory again until the encoded data can be properly or effectively decoded.

SUMMARY OF THE INVENTION

It is therefore one of the objectives of the present invention to provide a flash memory controller and corresponding flash memory reading method capable of early performing an operation of data read retry, to avoid a longer accessing time and improve performance of the whole system.

According to an embodiment of the present invention, a data reading method is disclosed. The data reading method comprises: utilizing a first sense voltage to read a data unit from a flash memory block; performing an error detection operation on the data unit and calculating an error polynomial according to a detection result; and determining whether the error polynomial conforms to a predetermined condition and deciding whether to perform read retry on the data unit according to a determining result.

According to the embodiment of the present invention, a flash memory controller is further disclosed. The flash memory controller comprises a reading circuit, a detecting circuit, and a decoding circuit. The reading circuit is utilized for utilizing a first sense voltage to read a data unit from a flash memory block. The detecting circuit is coupled to the reading circuit and utilized for performing an error detection operation on the data unit to generate a detecting result. The decoding circuit is coupled to the detecting circuit and utilized for calculating an error polynomial according to the detection result, determining whether the error polynomial conforms to a predetermined condition, and deciding whether to perform read retry on the data unit according to a determining result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
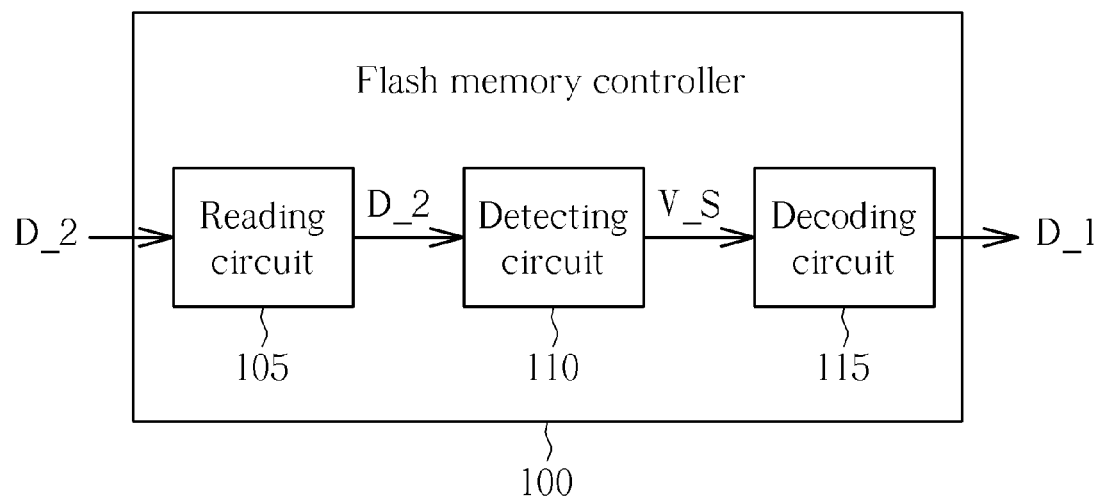
FIG. 1 is a block diagram of a flash memory controller according to an embodiment of the present invention.

Please refer to FIG. 1, which is a block diagram of a flash memory controller 100 according to an embodiment of the present invention. The flash memory controller 100 comprises a reading circuit 105, a detecting circuit 110, and a decoding circuit 115. The flash memory controller 100 is arranged to receive a data access command of a host (not shown in FIG. 1) and read/write data from/into a basic storage unit (i.e. a cell) of a flash memory not shown in FIG. 1 according to the data access command. For brevity, FIG. 1 shows a data flow direction of the data reading; however, this is not meant to be a limitation of the present invention. Data D_2 is encoded data which is previously stored in the flash memory, and data D_1 is raw data generated from decoding the encoded data D_2. Currently developed memory cells can be implemented by different storage architectures capable of storing one-bit, two-bit, or three-bit information at one time, respectively. Memory cells implemented by these storage architectures are respectively referred to as single level cell (SLC), multi level cell (MLC), and triple level cell (TLC). For the TLC, each cell includes eight different storage states at least, and therefore can be used for storing three-bit information at one time. In addition, the range of gate voltage of each cell can be formed by at least eight subdivided level ranges. The three-bit information stored in the cell is represented by which one of the subdivided level ranges the gate voltage falls within. In addition, the flash memory controller 100 can be applied to access memory cells corresponding to different storage architectures such as TLC, SLC, and MLC, etc. This is not intended to be a limitation of the present invention.

During data accessing, there may be several factors causing access errors. For example, after data storing operation has been finished, the gate voltage may decline, and thus the level of the gate voltage may be decreased. This may cause that information of data read from a cell is different from that previously to be stored when the data reading operation is performed to read data from the cell by using a predetermined sense voltage. In this situation, the predetermined sense voltage may be referred to as a deviated sense voltage. In order to solve this problem, the flash memory controller 100 in practice is arranged to perform error correction encoding upon data D_1 when storing the data D_1 into a flash memory. The flash memory controller 100 then stores encoded data (i.e. codeword data D_2) into a block of the flash memory. During data reading, the flash memory controller 100 is arranged to read the encoded codeword data D_2 from the block of the flash memory and then decode the encoded codeword data D_2 so as to generate the raw data D_1. Accordingly, by using error correction coding/decoding operation, this can moderately avoid information of data content being lost during data access. However, the correction capability of the error correction coding/decoding operation is not unlimited. The error correction coding/decoding operation may be used to correct N error bits at most; For example, N is equal to 68. Thus, when a codeword data includes more than N error bits, the flash memory controller 100 may not obtain or recover the raw data by performing error correction or debugging upon the codeword data. In this situation, the flash memory controller 100 is arranged to perform data read retry. There is a higher probability that a codeword data generated by using a deviated sense voltage includes more than N error bits while a codeword data generated by using a correct/appropriate sense voltage includes less than N error bits. Consequently, when performing data read retry, the flash memory controller 100 is arranged to control the flash memory for performing data reading operation and decoding of error correction code upon the codeword data a second time by using different sense voltages such as a different set of sense voltages. The data read retry operation is performed or executed repeatedly by using different sense voltages until the decoding of error correction code is able to correctly correct the error bits included within the codeword data. That is, the data read retry operation is performed repeatedly until the codeword data includes exact N error bits or less than N error bits.

Figure 2:
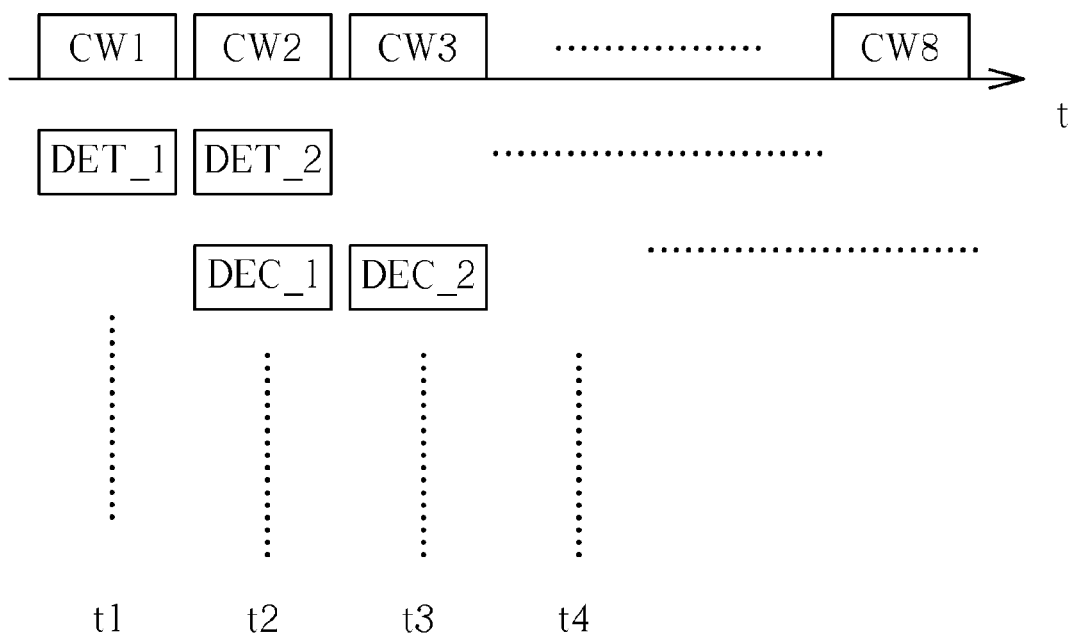
FIG. 2 is a diagram illustrating an ideal data processing flow for accessing a flash memory.

Please refer to FIG. 2, which is a diagram illustrating an ideal data processing flow for accessing a flash memory. As shown in FIG. 2, the horizontal axis t indicates a timeline, and t1-t4 respectively represent different timings. A group of codeword data CW1-CW8 is respectively read from corresponding cells of a flash block in sequence. For example, each codeword data includes data of 1024 bytes (i.e. 1 KB), and a page within of a flash memory is formed by eight codeword data including 8 KB data totally. The error detection operation and decoding of error correction code are used to sequentially process each of these codeword data to obtain/generate raw data. DET_1 is used to indicate a period used by the error detection operation for detecting the codeword data CW1, and DEC_1 is used to indicate a period used by the decoding of error correction code for decoding the codeword data CW1; the rest may be deduced by analogy. As shown in FIG. 2, merely a result of sequentially performing the error detection operation and the decoding operation of error correction code is illustrated. However, this is not intended to be a limitation of the present invention. This result is merely used to indicate that a circuit in the next stage can perform decoding operation upon the last codeword data (e.g. CW1) when a circuit in the current stage performs the error detection operation upon a current codeword data (e.g. CW2). This by no means indicates that the time used by the decoding operation for decoding a codeword data must be equal to that used by error detection operation for detecting the codeword data.

Figure 3:
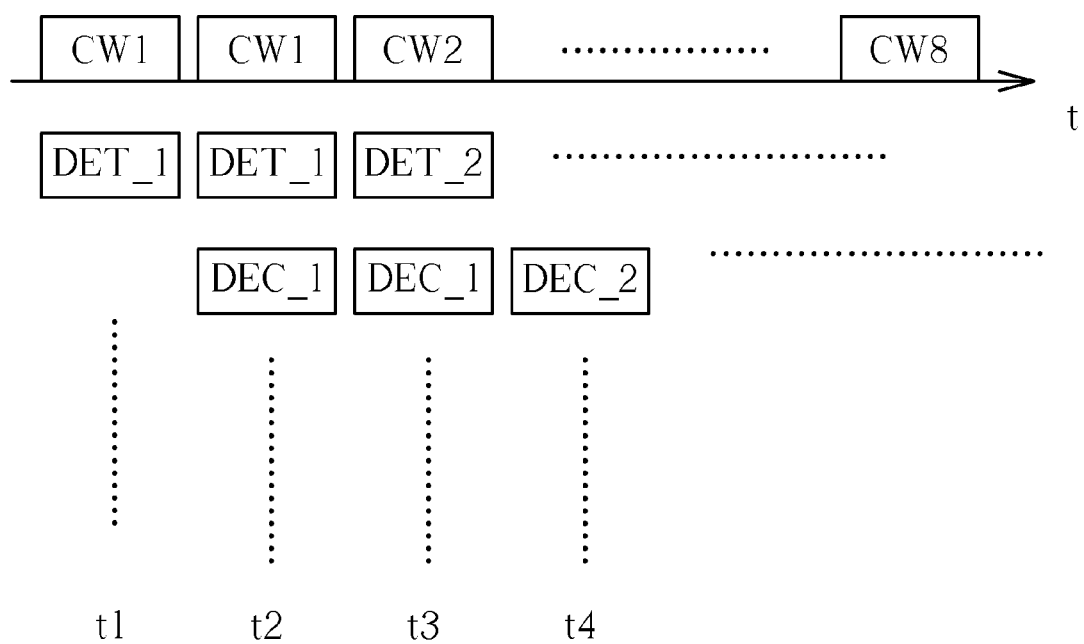
FIG. 3 is a diagram illustrating an example of a general data processing flow for accessing data of a flash memory.

In addition, the result of the data processing flow as shown in FIG. 2 is an optimal result, and each codeword data includes less than N error bits or exact N error bits. Thus, the operation of decoding each codeword data will succeed. After decoding the last codeword data (e.g. CW1), the decoding operation can be immediately used to decode the next codeword data, i.e. the current codeword data CW2. The error detection operation can be used to immediately perform error detection upon the next codeword data (e.g. CW3). However, as mentioned above, actually not all of these codeword data read out from the flash memory includes a number of error bits that is less than or exactly equal to a number of error bits which can be appropriately corrected by the decoding operation at most. Thus, it is required to frequently perform data read retry so as to read out the codeword data again. Once the data read retry has been performed for a codeword data, this indicates that the decoding operation had been performed at least one time for the codeword data and was not able to decode the codeword data at that time. As a result, it is necessary for the data processing flow to waste more time to process codeword data, and thus the whole performance will be degraded significantly. Please refer to FIG. 3, which is a diagram illustrating an example of a general data processing flow for accessing data of a flash memory. As shown in FIG. 3, the codeword data CW1 read out from the flash memory at timing t1 cannot be correctly decoded, and thus the data read retry is performed to read out the codeword data CW1 from the flash memory at timing t2. In other words, decoding operation of error correction code is performed for two times to process the codeword CW1 respectively at timings t2 and t3. A result indicating the codeword CW1 cannot be correctly decoded is obtained after the decoding operation executed at timing t2 is finished.

Since data read retry cannot be saved if it is required to perform the data read retry, and a result of the decoding operation is not obtained until the decoding operation is completely executed and finished, in this embodiment of the present invention, the flash memory controller 100 is arranged to immediately abandon or give up the decoding operation for a codeword data if there is a possibility that such the codeword cannot be correctly decoded by the decoding operation. The flash memory controller 100 then performs data read retry for the codeword data by using different sense voltage(s). That is, for improving performance, when a certain codeword data may not be correctly decoded by the error correction code, the flash memory controller 100 determines that the codeword data cannot be corrected and it is inappropriate to use the current sense voltage (i.e. the first sense voltage) to read out the codeword data from the flash memory. As a result, the flash memory controller 100 performs data read retry so as to use a different sense voltage such as the second sense voltage for reading out the codeword data from the flash memory. Thus, when there is a possibility that a codeword data cannot be corrected by error correction code, the flash memory controller 100 can immediately perform data read retry without executing whole the decoding operation of error correction code on such the codeword data. Therefore, a portion of the decoding operation such as an error position searching operation consuming more system resources is not needed to be executed; the whole computation time can be decreased, and more system resources can be saved. The whole system performance can be improved effectively.

Figure 4:
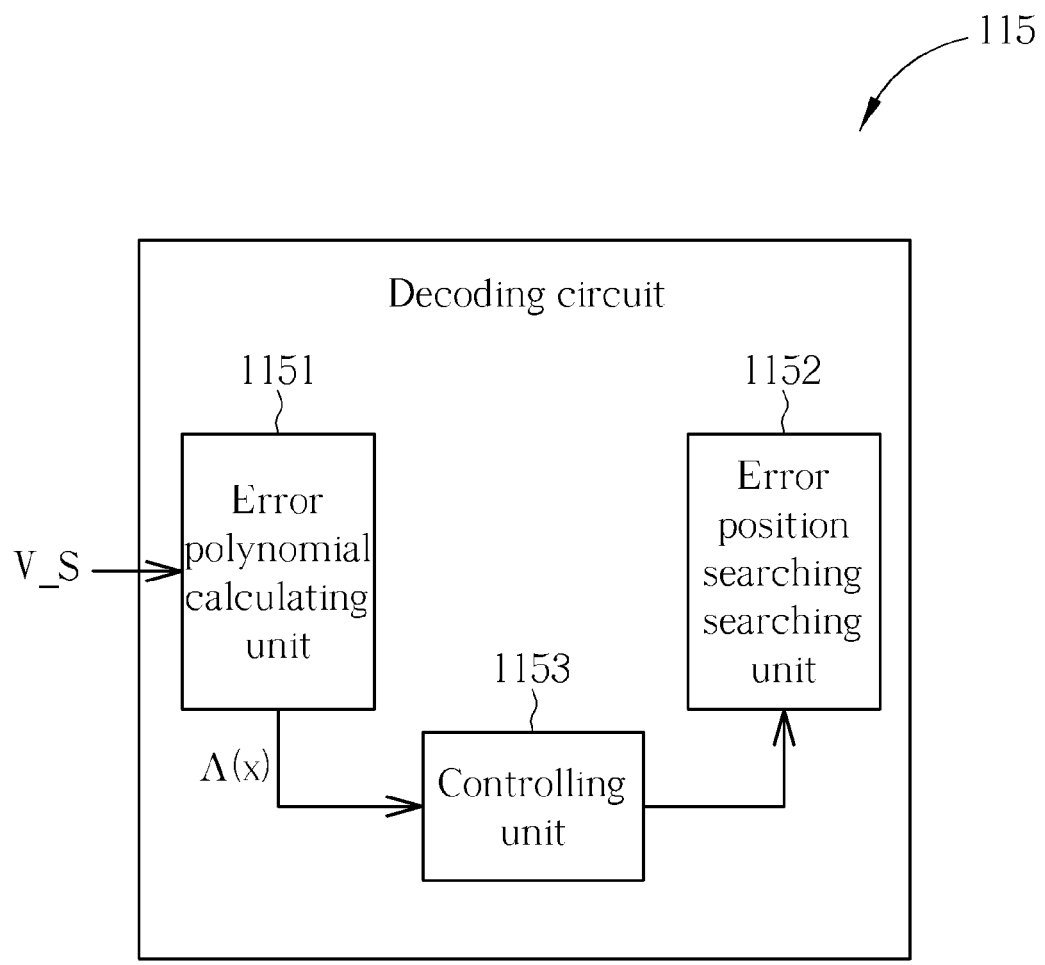
FIG. 4 is a block diagram of the decoding circuit as shown in FIG. 1.

In practice, the reading circuit 105 is arranged to read/receive a storage data unit (i.e. codeword data) from a flash memory block of the flash memory wherein the flash memory block includes one or multiple basic storage units. The detecting circuit 110 is coupled to the reading circuit 105 and used to perform an error detecting operation upon the received codeword data to generate a detecting result. The decoding circuit 115 is coupled to the detecting circuit 110, and is used to calculate an error polynomial according to the detection result outputted by the detecting circuit 110, determine whether the error polynomial conforms to a predetermined condition, and to decide whether to perform read retry upon the data unit (i.e. the codeword data) or continue a decoding operation according to a determining result. That is, the decoding circuit 115 determines whether to execute the whole of the decoding operation according to the determining result. More particularly, for an example of the decoding operation of BCH code, the decoding operation includes at least an error polynomial calculation and an error position searching operation. A failure of the decoding operation is confirmed when more than N error bits are found via execution of the error position searching operation. The value N herein indicates a number of error bits that can be corrected by the decoding operation of BCH code at most. Please refer to FIG. 4, which is a block diagram of the decoding circuit 115 as shown in FIG. 1. The decoding circuit 115 comprises an error polynomial calculating unit 1151, an error position searching unit 1152, and a controlling unit 1153. The error polynomial calculating unit 1151 is utilized for calculating the error polynomial by referring to the detecting result generated by the detecting circuit 110. The detecting result is used to indicate a syndrome value V_S generated by the detecting circuit 110 for performing the error detecting operation upon the codeword data. When the syndrome value V_S is equal to zero, this indicates that the codeword data includes no error bits. When the syndrome value V_S is not equal to zero, this indicates that the codeword data includes at least one error bit. The error polynomial calculating unit 1151 is used to calculate the error polynomial $\Lambda(x)$ by referring to the syndrome value V_S. Thus, when the syndrome value V_S is not equal to zero, the error polynomial calculating unit 1151 can calculate the error polynomial $\Lambda(x)$ which is not equal to zero. In addition, the error position searching unit 1152 is coupled to the error polynomial calculating unit 1151 and used to perform the error position searching operation according to the error polynomial $\Lambda(x)$. For example, the error position searching operation can be Chien-search operation. However, this is merely used for illustrative purposes and not intended to be a limitation of the present invention. In addition, the controlling unit 1153 is coupled to the error polynomial calculating unit 1151 and error position searching unit 1152, and is utilized for determining whether a largest degree of the error polynomial $\Lambda(x)$ conforms to the predetermined condition to generate the determining result. Further, the controlling unit 1153 is arranged to control the error position searching unit 1152 to decide whether to perform the error position searching operation. When the determining result indicates that the largest degree conforms to the predetermined condition, the controlling unit 1153 decides performing data read retry upon the codeword data by using a second sense voltage or a second set of sense voltages without executing the error position searching operation. When the determining result indicates that the largest degree does not conform to the predetermined condition, the controlling unit 1153 decides to execute the error position searching operation and perform error correction upon the codeword data read via the first sense voltage. That is, the controlling unit 1153 decides to continue the decoding operation.

For example, the error polynomial $\Lambda(x)$ calculated by the error polynomial calculating unit 1151 can be represented by the following equation:

$$\Lambda(x) = \Lambda_n x^n + \ldots + \Lambda_0 x^0$$

wherein the value n is the largest degree of the error polynomial $\Lambda(x)$, and $\Lambda_n$ is a coefficient of a term corresponding to the largest degree in the error polynomial $\Lambda(x)$. The coefficient $\Lambda_n$ is not equal to zero. The controlling unit 1153 determines a relation between the value n and the number N of error bits that can be corrected by the error position searching unit 1152 at most, so as to decide whether to continue performing the decoding operation (i.e. the error position searching operation) or immediately perform data read retry without spending time and resources to execute the subsequent portion of the decoding operation. When the codeword data includes less than N error bits such as M error bits (the value M is smaller than the value N), the largest degree n is also smaller than N due to the property of the error polynomial $\Lambda(x)$. When the codeword data includes N error bits, the largest degree n of the error polynomial $\Lambda(x)$ is equal to N exactly. When the codeword data includes more than N error bits such as L error bits (the value L is greater than the value N), the largest degree n of the error polynomial $\Lambda(x)$ is also equal to the value N. Thus, when the largest degree n is exactly equal to the number of error bits N that can be corrected by the decoding operation of error correction code at most, there is a probability that the decoding operation can be used to correct the codeword data appropriately while there is another probability that the codeword data cannot be corrected by the decoding operation. However, whether the decoding operation is able to correct the codeword data cannot be confirmed until the whole of error position searching operation is finished. If exact N error bits are found after the whole of error position searching operation is finished, this indicates that the decoding operation of error correction code is able to correct the codeword data. If multiple roots are found after the whole of error position searching operation is finished, this indicates that the decoding operation cannot correct the codeword data.

For example, if the value N is equal to 68, the controlling unit 1153 determines that the error position searching unit 1152 can find less than 68 error bits and it therefore able to perform decoding operation of error correction code to obtain raw data when the largest degree n is smaller than the value 68. Otherwise, when the largest degree n is equal to the value 68, this indicates that the codeword data may include exact 68 error bits or more than 68 error bits. Since actually the number of error bits is determined until an execution of whole error position searching operation is finished, there is a higher probability that the decoding operation of error correction code cannot correct the error bits within the codeword data when the largest degree n of the error polynomial is exactly equal to the value 68 which is the number of error bits that can be corrected by the error correction code at most. Accordingly, in this embodiment, to avoid consuming time and resources to execute the decoding operation of error correction code that may not properly correct codeword data, the controlling unit 1153 determines that it is not efficient to perform the error position searching operation when the largest degree n is equal to the value 68 since this will expend more system resources. As a result, the controlling unit 1153 disables performing the error position searching operation of the error position searching unit 1152 upon the codeword data. In other words, the predetermined condition mentioned above is: the largest degree n is not smaller than a maximum number N (e.g. 68) of error bits that can be corrected by the decoding operation of the error correction code. Consequently, when the largest degree n is equal to the value 68, this indicates that the largest degree n conforms to the predetermined condition, and the decoding circuit 115 decides not to execute a subsequent portion of the decoding operation of error correction code. The flash memory controller 100 then activates data read retry and controls the flash memory to perform data read retry upon the codeword data with a different sense voltage. That is, before performing the error position searching operation upon the codeword data read by using the first sense voltage(s), data read retry is immediately performed to read the codeword data again by using a second sense voltage (or a second set of sense voltages) different from the first sense voltage (i.e. the first set of sense voltages). When the largest degree n is smaller than the value 68, this indicates that the largest degree n does not conform to the predetermined condition, and the decoding circuit 115 performs the error correction code or debugging upon the codeword data read by using the first sense voltage mentioned above. In practice, the data size of a codeword data is equal to 1024 bytes (1 KB), for example. The decoding operation of error correction code is able to correct 68 error bits at most. When the largest degree n is equal to the value 68, there is a very small probability that the codeword data includes exact 68 error bits; usually, in this situation, the codeword data may include more than 68 error bits. Since there is a greater probability that the codeword data includes more than 68 error bits in that situation, immediately performing data read retry with different sense voltage(s) can save much time and more resources although it may be redundant for the system to execute the data read retry when the codeword data exactly includes 68 error bits. As a result, the performance of the whole system can be improved effectively.

Figure 5:
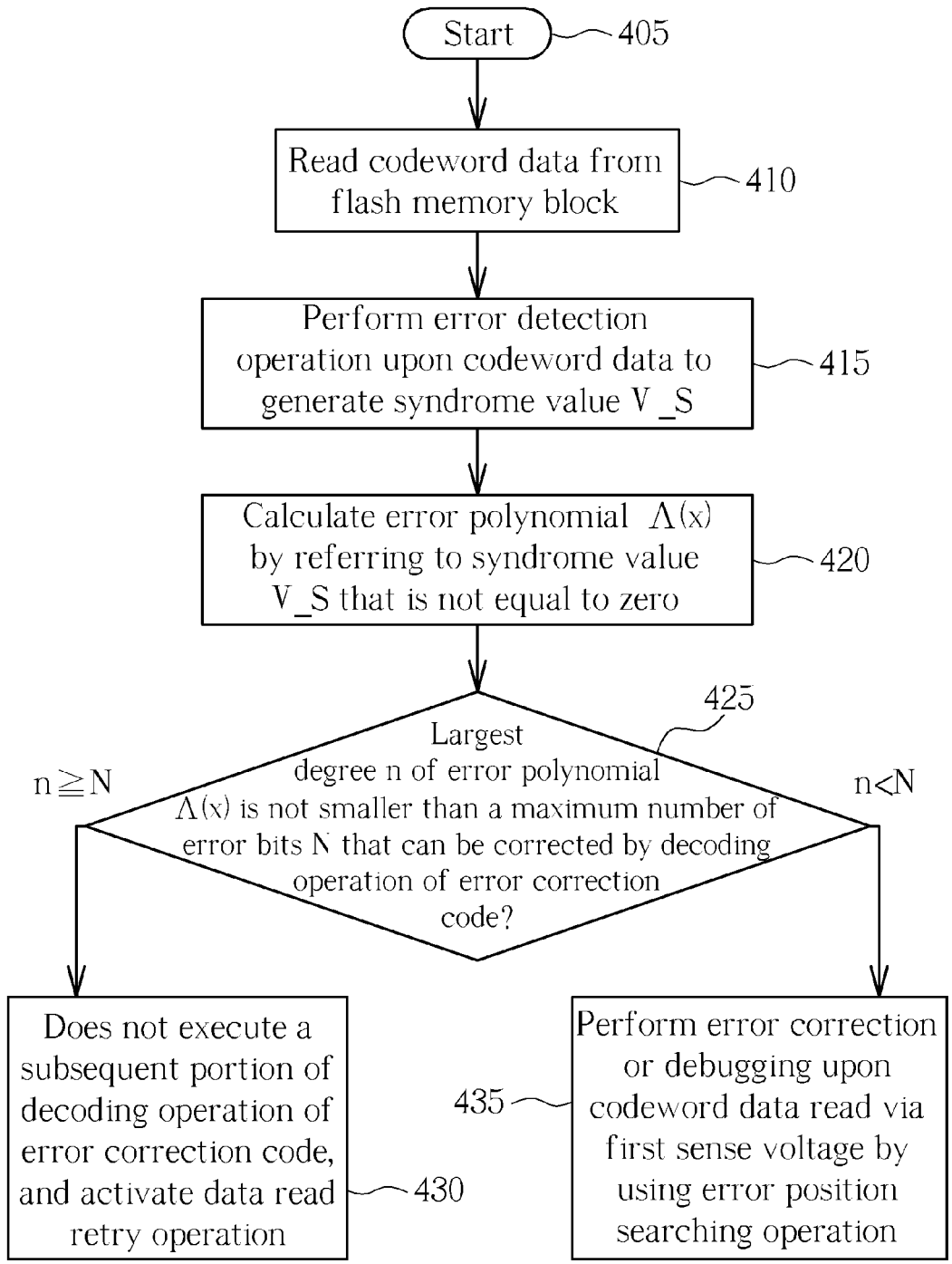
FIG. 5 is a diagram illustrating a flowchart of the operation of the flash memory controller as shown in FIG. 1.

Please refer to FIG. 5, which is a diagram illustrating a flowchart of the operation of the flash memory controller 100 as shown in FIG. 1. Provided that substantially the same result is achieved, the steps of the flowchart shown in FIG. 5 need not be in the exact order shown and need not be contiguous, that is, other steps can be intermediate. The description of the steps is detailed in the following:

Step 405: Start;

Step 410: The reading circuit 105 receives a codeword data from a flash memory block;

Step 415: The detecting circuit 110 performs an error detection operation upon the codeword data to generate a syndrome value V_S;

Step 420: The error polynomial calculating unit 1151 calculates an error polynomial $\Lambda(x)$ by referring to the syndrome value V_S that is not equal to zero;

Step 425: The controlling unit 1153 determines whether the largest degree n of the error polynomial $\Lambda(x)$ is not smaller than a maximum number of error bits N that can be corrected by the decoding operation of error correction code? If yes, the flow goes to Step 430; otherwise, the flow goes to Step 435;

Step 430: The controlling unit 1153 does not execute a subsequent portion of decoding operation of error correction code, and the flash memory controller 100 activates the operation of data read retry; and Step 435: The decoding circuit 115 performs error correction or debugging upon the codeword data read via the first sense voltage mentioned above by using the error position searching operation of the error position searching unit 1152.

Further, in another embodiment, the predetermined condition mentioned above can be: the largest degree n of the error polynomial $\Lambda(x)$ is not smaller than a number of bits M that may be corrected by the error correction operation. The value M is smaller than the value N which is a maximum number of bits that can be corrected by the error correction operation. For example, if the value N is equal to 68, the value M can be equal 67. under this predetermined condition, the controlling unit 1153 is arranged to determine whether the largest degree n of the error polynomial $\Lambda(x)$ is not smaller than the value M so as to decide whether to immediately activate the operation of data read retry or to continue executing the error correction operation. The detail description of steps is similar to that as shown in FIG. 5, and the only difference depends on the predetermined condition (i.e. the largest degree n of the error polynomial $\Lambda(x)$ is not smaller than the number of bits M that may be corrected by the error correction operation). Accordingly, this is not detailed here for simplicity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data reading method comprises:
   utilizing a first sense voltage to read a data unit from a flash memory block;
   performing an error detection operation on the data unit and calculating an error polynomial according to a detection result; and
   determining whether the error polynomial conforms to a predetermined condition; comprising:
      determining whether a largest degree of the error polynomial conforms to the predetermined condition to generate a determining result; and
   deciding whether to perform read retry on the data unit according to the determining result, comprising:
      using a second sense voltage to perform read retry on the data unit when the determining result indicates that the largest degree conforms to the predetermined condition; and
      performing an error correction upon the data unit read via the first sense voltage when the determining result indicates that the largest degree does not conform to the predetermined condition.

2. The data reading method of claim 1, wherein the predetermined condition is: the largest degree is not smaller than a bit number of error bit correction capability of the error detection operation.

3. The data reading method of claim 2, wherein the number is a maximum bit number of error bit correction capability of the error detection operation.

4. The data reading method of claim 1, wherein the first sense voltage is different from the second sense voltage.

5. The data reading method of claim 1, wherein the step of performing the error detection operation on the data unit and calculating the error polynomial according to the detection result comprises:
   detecting the data unit to generate a syndrome value as the detection result; and
   calculating the error polynomial according to syndrome value when the syndrome value is not zero.

6. A flash memory controller, comprising:
   a reading circuit, for utilizing a first sense voltage to read a data unit from a flash memory block;
   a detecting circuit, coupled to the reading circuit, for performing an error detection operation on the data unit to generate a detecting result; and
   a decoding circuit, coupled to the detecting circuit, for calculating an error polynomial according to the detection result, determining whether the error polynomial conforms to a predetermined condition, and deciding whether to perform read retry on the data unit according to a determining result, comprising:
      an error polynomial calculating unit, for referring to the detection result to calculate the error polynomial;
      an error position searching unit, coupled to the error polynomial calculating unit, for performing an error position searching operation according to the error polynomial; and
      a controlling unit, coupled to the error polynomial calculating unit and the error position searching unit, for determining whether a largest degree of the error polynomial conforms to the predetermined condition to generate the determining result, and controlling the error position searching unit to decide whether to perform the error position searching operation;
   wherein the controlling unit is arranged to use a second sense voltage to perform the read retry on the data unit without performing the error position searching operation when the determining result indicates that the largest degree conforms to the predetermined condition; and, the controlling unit is arranged to perform the error position searching operation and an error correction upon the data unit read via the first sense voltage when the determining result indicates that the largest degree does not conform to the predetermined condition.

7. The flash memory controller of claim 6, wherein the predetermined condition is: the largest degree is not smaller than a bit number of error bit correction capability of the error detection operation.

8. The flash memory controller of claim 7, wherein the number is a maximum bit number of error bit correction capability of the error detection operation.

9. The flash memory controller of claim 6, wherein the first sense voltage is different from the second sense voltage.

10. The flash memory controller of claim 6, wherein the detecting circuit is arranged to detect the data unit to generate a syndrome value as the detection result, and calculate the error polynomial according to syndrome value when the syndrome value is not zero.

11. A data reading method comprises:
   utilizing a first sense voltage to read a data unit from a flash memory block;
   performing an error detection operation on the data unit and calculating an error polynomial according to a detection result; and
   determining whether the error polynomial conforms to a predetermined condition and when the error polynomial does not conform to the predetermined condition, deciding to perform read retry on the data unit under original data reading conditions, and when the error polynomial conforms to the predetermined condition, deciding to perform read retry on the data unit under different data reading conditions from the original data reading conditions.

12. A flash memory controller, comprising:
   a reading circuit, for utilizing a first sense voltage to read a data unit from a flash memory block;
   a detecting circuit, coupled to the reading circuit, for performing an error detection operation on the data unit to generate a detecting result; and
   a decoding circuit, coupled to the detecting circuit, for calculating an error polynomial according to the detection result, determining whether the error polynomial conforms to a predetermined condition, and when the error polynomial does not conform to the predetermined condition, deciding to perform read retry on the data unit under original data reading conditions, and when the error polynomial conforms to the predetermined condition, deciding to perform read retry on the data unit under different data reading conditions from the original data reading conditions.

* * * * *